United States Patent [19]

Davis

[11] 4,451,101

[45] May 29, 1984

[54] COVER PLATE FOR AN ELECTRICAL RECEPTACLE

[76] Inventor: Thomas A. Davis, 21 California Ave., #331, Irvine, Calif. 92715

[21] Appl. No.: 390,619

[22] Filed: Jun. 21, 1982

[51] Int. Cl.³ ...................... H01R 13/447; H05K 5/03

[52] U.S. Cl. .................................. 339/44 M; 174/67; 220/242; 339/37; 339/44 R

[58] Field of Search .................... 339/44 R, 37, 44 M, 339/36, 43, 38, 40, 39; 174/67; 220/242

[56] References Cited

U.S. PATENT DOCUMENTS

| | | | |
|---|---|---|---|
| 2,510,745 | 6/1950 | Kilgore | 174/67 |
| 2,880,264 | 3/1959 | Ruskin | 339/44 R |
| 2,916,733 | 12/1959 | Hirsch | 174/67 |
| 3,096,409 | 7/1963 | Hubbell et al. | 174/67 X |
| 3,131,985 | 5/1964 | Blander | 339/37 |
| 3,198,373 | 8/1965 | Ramsing | 220/242 |
| 3,467,763 | 9/1969 | Shaw | 174/67 |

FOREIGN PATENT DOCUMENTS

| | | | |
|---|---|---|---|
| 2458243 | 10/1976 | Fed. Rep. of Germany | 174/67 |
| 1491261 | 7/1967 | France | 339/44 M |

*Primary Examiner*—William R. Briggs

*Attorney, Agent, or Firm*—Fischer, Tachner & Strauss

[57] ABSTRACT

A combination cover plate and safety guard plate to be interfaced with a conventional electrical wall receptacle to prevent a child of tender years from gaining unauthorized access to the receptacle and sustaining serious injury from an electric shock as a consequence of an accidental contact with a current carrying wire. The cover plate is adapted to receive one or more of the electrical receptacles, so that the power can be supplied therefrom to an electrical appliance, or the like. The cover plate and safety guard plate are pivotably interconnected with one another at first ends thereof. Each of the second ends of the cover plate and safety guard plate includes respective spring-biased retaining means by which the cover and safety guard plates can be releaseably connected together. Accordingly, the safety guard plate may be rotated towards the cover plate and secured in a position across the face thereof, whereby to cover the receptacles and prevent unauthorized access thereto. The safety guard plate may be rotated away from the cover plate by exerting sufficient force against the bias of a spring, whereby to permit the disconnection of the respective retaining means. The spring is selected so that the force required to disconnect the respective retaining means is greater than that which a child of tender years is capable of exerting.

6 Claims, 9 Drawing Figures

COVER PLATE FOR AN ELECTRICAL RECEPTACLE

BACKGROUND OF THE INVENTION

1. Field of the Invention

This invention relates to a combination cover plate and safety guard plate to be interfaced with an electrical wall receptacle to prevent young children, or the like, from sustaining injury at the receptacle due to an electrical shock as a consequence of an accidental contact with a current carrying wire.

2. Prior Art

As is well known to parents of small children, an unguarded electrical wall receptacle represents an ever present source of danger to the curious child who attempts to tamper with the receptacle. Young children have been known to sustain serious injury from an electrical shock as a consequence of an accidental contact with a current carrying wire at an unguarded receptacle.

What is more, many interior design conscious individuals have found that the appearance of an unused electrical receptacle and cover plate do not visually harmonize with the surface of the household wall at which the receptacle is located. Therefore, to prevent an obtrusive appearance, it would be desirable to cover the receptacle until access to an electrical power source is needed.

Safety guards to prevent unauthorized access to and accidental injury at an electrical wall receptacle are known in the prior art. Examples of such prior art safety guards may be found by referring to any one of the following U.S. patents:

U.S. Pat. No. 2,744,243, issued May 1, 1956;
U.S. Pat. No. 3,036,170, issued May 22, 1962;
U.S. Pat. No. 3,068,442, issued Dec. 11, 1962; and
U.S. Pat. No. 4,279,457, issued July 21, 1981.

However, none of the aforementioned safety guards includes a pair of pivotally interconnected plates which are adapted to assume positions relative to one another, whereby to prevent unauthorized access to an electrical receptacle while, at the same time, removing the receptacle and its cover plate from view.

SUMMARY OF THE INVENTION

It is a primary object of the present invention to provide a combination cover plate and safety guard plate, which plates are pivotably interconnected with one another and adapted to be interfaced with an electrical wall receptacle in order to prevent a child of tender years from sustaining an injury as a consequence of tampering with the receptacle.

It is a further object of this invention that the safety guard plate of the present combination be removably connected across the face of the cover plate, so as to remove the electrical receptacle from view until access to an electrical power source is needed.

It is still a further object of this invention that the present combination includes spring-biased retaining means for locking the safety guard plate in a closed position across the face of the cover plate.

It is an additional object of this invention that the spring-biased retaining means require sufficient operating force so as to prevent a child of tender years from removing the safety guard plate and gaining unauthorized access to the electrical receptacle.

It is yet an additional object of the present invention that the present safety guard plate have an attractive appearance, so as to either match or be compatible with the wall treatment (e.g. the paint or paper) at which the receptacle is located.

These and other objects and advantages of the invention will become apparent as the following description proceeds and the features of novelty which characterize this invention are pointed out with particularity in the claims annexed hereto.

DESCRIPTION OF THE PREFERRED EMBODIMENT

Figure 1:
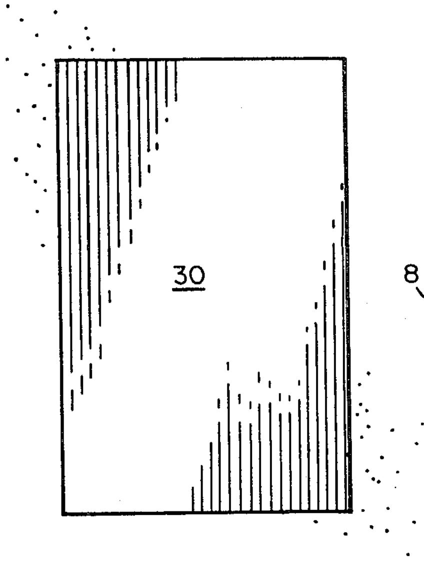
FIG. 1 shows the combination cover plate and safety guard plate of the present invention interfaced with a pair of electrical wall receptacles, with the safety guard plate moved to a closed position across the cover plate and the receptacles thereof.
Figure 2:
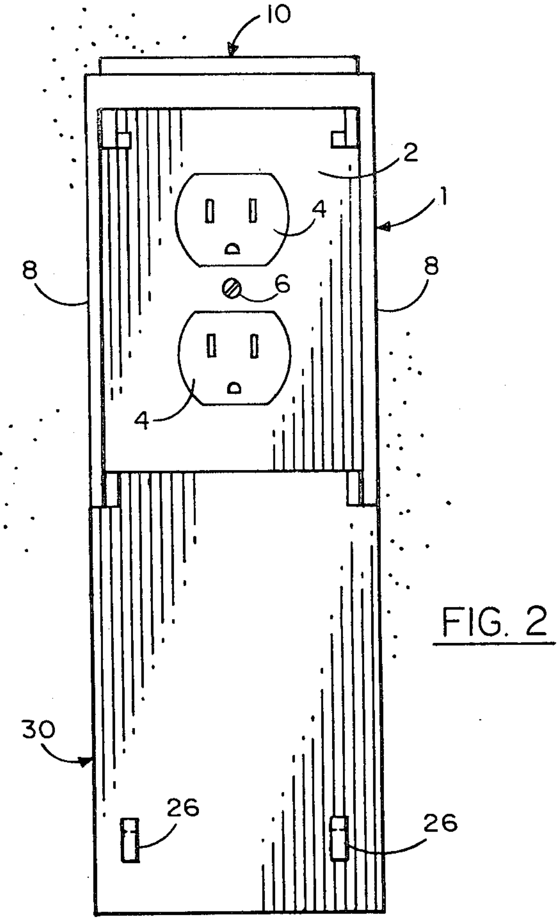
FIG. 2 shows the combination cover plate and safety guard plate of the present invention, with the safety guard plate moved to an opened position so as to expose the receptacles.

A combination cover plate and safety guard plate which forms the present invention for preventing a child of tender years from gaining unauthorized access to and tampering with an electrical wall receptacle is best disclosed while referring initially and concurrently to FIGS. 1, 2, 3 and 4 of the drawings. In a preferred embodiment of the invention, each of the presently disclosed cover plate 1 and safety guard plate 30 are fabricated (e.g. molded) from a suitable plastic material. As is best shown in FIG. 2, first ends of the cover plate 1 and safety guard plate 30 are pivotably connected together by means of a suitable pin (designated 34 in FIGS. 5–9). Therefore, and as will be described in greater detail hereinafter, safety guard plate 30 is adapted to be rotated from an opened position (of FIG. 2) to a closed position (of FIG. 1), whereupon guard plate 30 is located over and atop cover plate 1.

Similar to conventional face plates, the face 2 of cover plate 1 has a pair of apertures formed therein. Each aperture is dimensioned so as to receive therethrough a respective, conventional electrical wall receptacle 4. Receptacles 4 are aligned flush with the face 2 of the cover plate 1, so that, in the opened position of FIG. 2, a convenient source of electricity is available when power is needed to drive an electrical appliance, or the like. A screw 6, or similar retaining means, extends through the face 2 of cover plate 1, whereby to secure the cover plate 1 against a wall and to an existing electrical receptacle 4.

Figure 3:
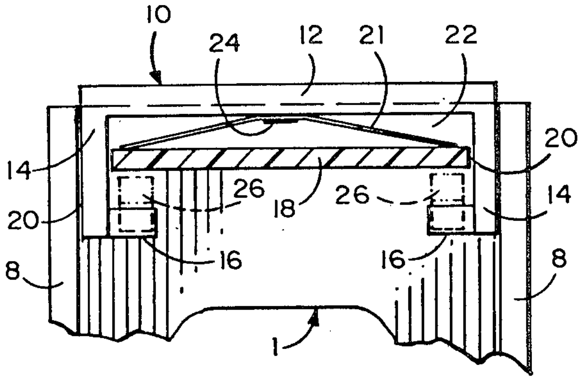
FIG. 3 shows details of the retaining means of the cover plate by which to secure the safety guard plate in the closed position thereover.

However, and unlike face plates of the prior art, the present cover plate 1 includes a pair of side frame members 8, which members are coextensively formed (i.e. molded) with and extended outwardly from the face 2 thereof. Located between the frame members 8 is a C-shaped guard plate release bar 10. As is best shown in FIG. 3, guard plate release bar 10 comprises a top portion 12 coextensively formed with a pair of side portions 14. Release bar 10 is preferably fabricated from a plastic material. As will be better described when referring to FIGS. 5–9, the top portion 12 of release bar 10 may be manually depressed with sufficient force in order to permit an authorized user to gain access to electrical receptables 4. Each side portion 14 of release bar 10 terminates with a respective post 16, which posts are coextensively formed with and projected inwardly and in alignment with one another from opposite side portions 14. In a preferred embodiment of the invention, posts 16 have a cylindrical configuration.

Coextensively formed (i.e. molded) with and projecting outwardly from the interior surface of cover plate 1 is a retaining bar 18. Retaining bar 18 extends between the side frame members 8 of cover plate 1. However, relatively short gaps 20 are respectively formed between each of the ends of retaining bar 18 and the side frame members 8, so that the side portions 14 of guard plate release bar 10 can be slideably received therethrough. A spring 21 having a generally arcuate configuration and conventional composition is located between the top of retaining bar 18 and the bottom of the top portion 12 of guard plate release bar 10. Spring 21 may either be loosely suspended within a hollow chamber 22 formed between guard plate release bar 10 and retaining bar 18 or attached (e.g. at the bottom of the top portion 12 of release bar 10) thereat by means of a rivet 24, or like retaining means. Guard plate release bar 10 includes a front lip (designated by reference numeral 32 in FIGS. 5–9) by which to prevent the removal of spring 21 from hollow chamber 22.

Figure 4:
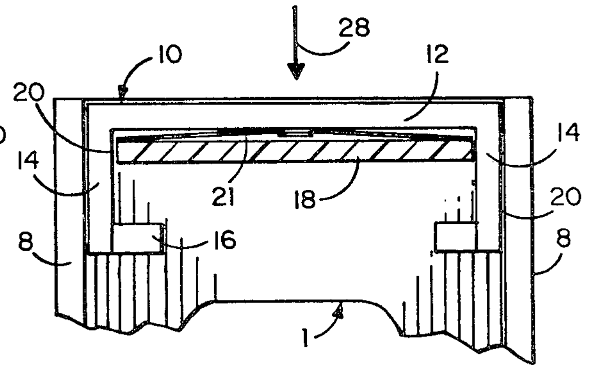
FIG. 4 shows the details of the retaining means of FIG. 3 when releasing the safety guard plate from the cover plate for movement to the opened position.

Referring particularly to the assembled relationship illustrated by FIGS. 3 and 4 of the drawings, it will be apparent that each of the side portions 14 of guard plate release bar 10 is adapted for reciprocal movement through the gaps 20 formed between side frame members 8 and retaining bar 18. That is, in a relaxed condition, arcuate spring 21 biases the guard plate release bar 10 in a position whereby the top portion 12 thereof extends upwardly from and slightly above the termination of the side frame members 8 of cover plate 1. Guard plate release bar 10 is, accordingly, adapted to engage a pair of hook-shaped catches 26 of safety guard plate 30, so that the guard plate 30 may be rotated to and retained in a closed position (of FIG. 1) over cover plate 1, whereby to block access to the receptacles of cover plate 1.

More particularly, a pair of hook-shaped catches 26 extend outwardly from the interior surface of safety guard plate 30. As is best shown in FIG. 3, when guard plate 30 is rotated from an opened to a closed position, each of the catches 26 (shown in phantom) is adapted to engage guard plate release bar 10 at a respective inwardly projecting post 16 thereof. The action of spring 21 in its relaxed condition causes the posts 16 to be positioned and maintained adjacent retaining bar 18, so that each of the catches 26 is thereby prevented from becoming accidentally disengaged from its respective post 16.

When access to the electrical receptacles of cover plate 1 is desired, a user exerts a sufficient force (in a direction designated by arrow 28 of FIG. 4) at the top portion 12 of guard plate release bar 10 and against the bias of spring 21. Accordingly, spring 21 is compressed and the side portions 14 of release bar 10 are moved downwardly through gaps 20. This downward movement of release bar 10 causes the posts 16 thereof to be moved away from retaining bar 18 in order that the hook-shaped catches 26 of safety guard plate 30 may be disengaged from posts 16. Safety guard plate 30 may then be rotated under the influence of gravity to the opened position of FIG. 2.

Figure 5:
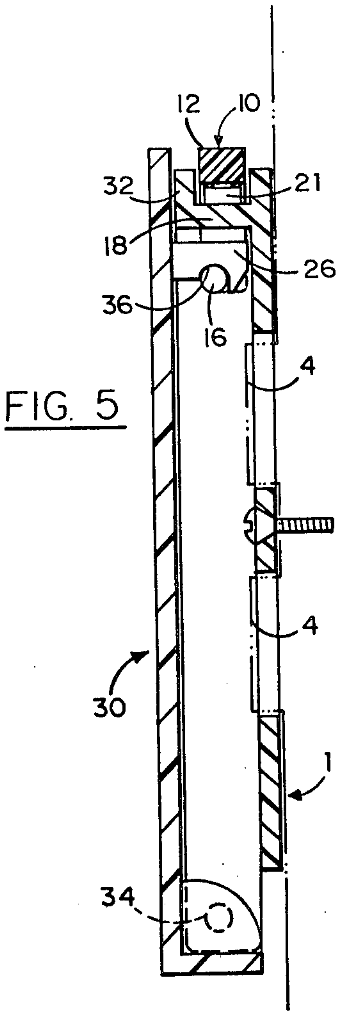
FIGS. 5–9 describe the operation by which the safety guard plate is moved from the closed to the opened position relative to the cover plate.

The operation of the combination cover plate 1 and safety guard plate 30 is now described while referring to FIGS. 5–9 of the drawings. FIG. 5 shows the safety guard plate 30 being retained in a closed position over cover plate 1, so as to block access to the electrical receptacles 4. Inasmuch as the combination cover plate and safety guard plate were previously described in the closed position when referring to FIGS. 1 and 3, only a brief description thereof will again be provided. In the closed position, safety guard plate 30 is rotated around pin 34, so that the pair of hook-shaped catches 26 thereof (only one of which being shown) are moved into releaseable engagement with the posts 16 of guard plate release bar 10. The front lip 32 of guard plate release bar 10 also functions as a stop by which to limit the rotational movement of safety guard plate 30 when plate 30 is moved to the closed position over cover plate 1. Each of the hook-shaped catches 26 includes a recess 36 formed therein, which recess has a configuration that generally conforms to the shape of a post 16, whereby each hook-shaped catch 26 is adapted to receive a respective post in the recess 36 thereof. Spring 21 assumes a relaxed condition, so as to force the top portion 12 of guard plate release bar 10 slightly above the side frame members (designated 8 in FIGS. 2 and 3) of cover plate 1. As was previously disclosed, when in the closed position, the posts 16 of guard plate release bar 10 are positioned adjacent retaining bar 18, so as to prevent the accidental disengagement of hook-shaped catches 26 from posts 16.

Figure 6:
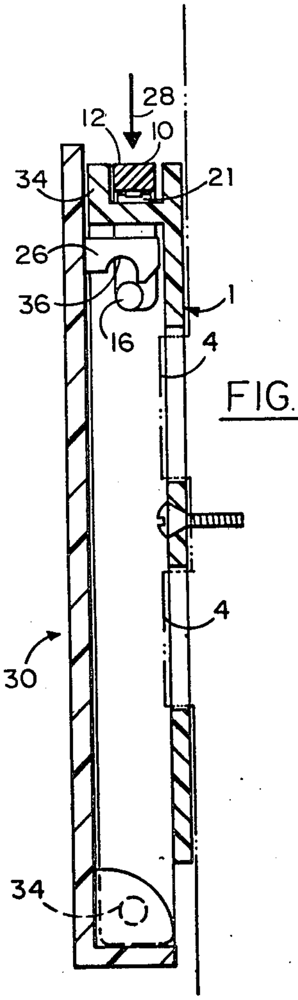

To release hook-shaped catches 26 from their respective posts 16, whereby access to electrical receptacles 4 may be obtained, a suitable force is exerted (in the direction of arrow 28) upon the top portion 12 of guard plate release bar 10. As is best shown in FIG. 6, when sufficient force is exerted upon release bar 10, spring 21 is compressed and the posts 16 of release bar 10 are moved downwardly and out of engagement with the recesses 36 formed in hook-shaped catches 26. As an important advantage of the present invention, the spring 21 may be particularly selected, so that a child of tender years will not be capable of exerting enough force whereby to depress guard plate release bar 10 and thereby release catches 26 from their respective posts 16. In this fashion, the presently disclosed combination cover plate 1 and safety guard plate 30 will provide a means by which to prevent a young child from gaining an unauthorized access to and tampering with an electrical wall receptacle.

Figure 7:
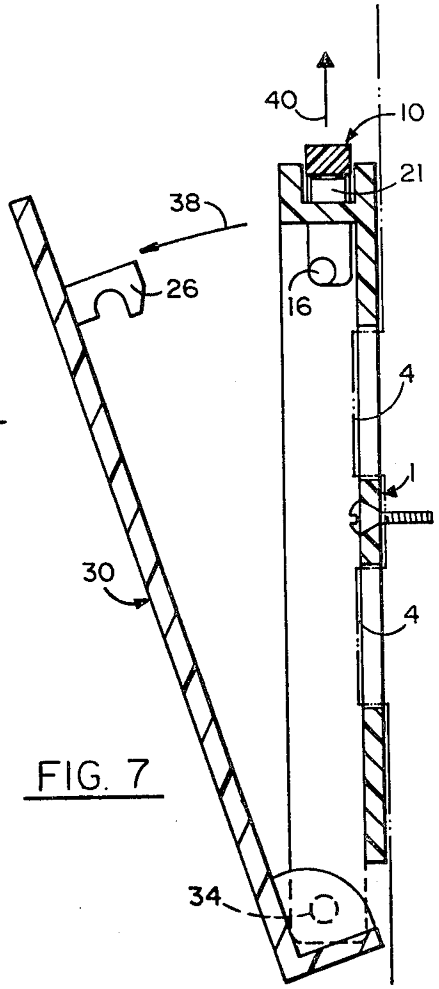
Figure 9:
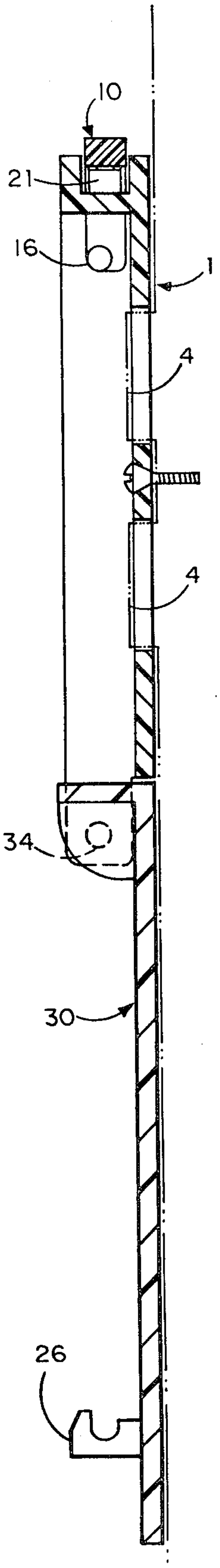

With hook-shaped catches 26 disengaged from their respective posts 16, safety guard plate 30 can be rotated towards an opened position under the influence of gravity and in a direction designated by arrow 38 of FIG. 7. Spring 21 returns to its relaxed condition, whereupon to cause guard plate release bar 10 to be moved, in a direction indicated by arrow 40, back to a position above the side frame members 8 of cover plate 1. Safety guard plate 30 will continue to rotate around pin 34 until plate 30 drops into substantially vertical alignment with cover plate 1. The aforementioned vertical alignment, when the combination cover plate 1 and safety guard plate 30 are in an opened position, is best illustrated in FIG. 9. Accordingly, the electrical receptacles 4 at cover plate 1 are made quickly and easily accessible to an authorized user, whenever a source of electrical power is required.

Figure 8:
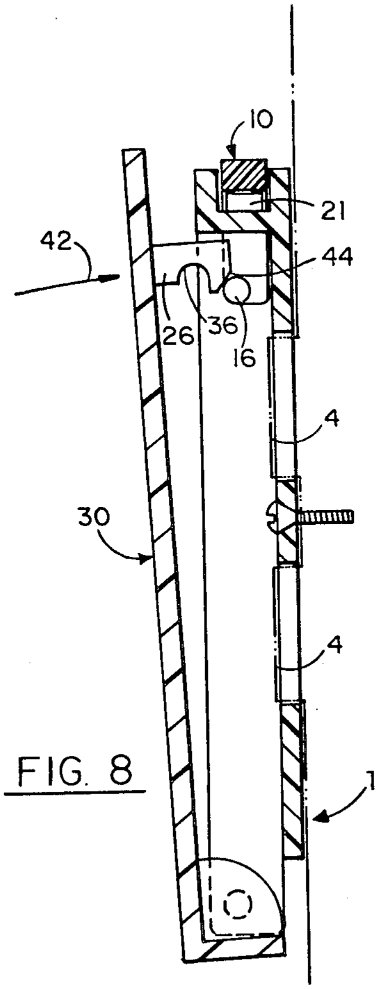

When it is desirable to again prevent an unauthorized access to the electrical receptacles 4 of cover plate 1, safety guard plate 30 is rotated around pin 34 and moved toward cover plate 1 in a direction indicated by arrow 42. Eventually, and as is best illustrated in FIG. 8, the hook-shaped catches 26 of guard plate 30 will be moved into contact with posts 16. Each hook-shaped catch 26 has a beveled surface 44 formed at the front thereof. Beveled surfaces 44 are dimensioned so as to force the guard plate release bar 10 and the posts 16 thereof in a downward direction whereby to compress the spring 21. Accordingly, hook-shaped catches 26 are moved over respective posts 16, until the posts 16 are captured by the recesses 36 formed in the catches 26. Spring 21 then returns to a relaxed condition, and release bar 10 is moved to a location above the side frame members 8 of cover plate 1 (as is illustrated in FIG. 3). The safety guard plate 30 is thus retained in a closed position over cover plate 1 until access to electrical receptacles 4 is desired by one with sufficient strength to operate release bar 10 (in a manner as was previously described when referring to FIG. 6).

As is best shown in the closed position of FIG. 1, safety guard plate 30 comprises a continuous planar surface that extends over the face of cover plate 1, whereby to remove the electrical receptacles thereof from view. Accordingly, an interior decorator or a user of the presently disclosed combination cover plate 1 and safety guard plate 30 may wish to decorate the exterior surface of guard plate 30 so as to be compatible with the covering of the wall at which electrical receptacles (e.g. 4) are located. That is, and by way of example, the safety guard plate 30 may be painted, covered with wall paper, or fabricated from a suitably colored, textured or veneered plastic material in order that the guard plate 30 may have an attractive or unobtrusive appearance relative to the background wall treatment. Hence, the presently disclosed combination is easily and suitably adapted for use at any structure having one or more electrical wall receptacles, regardless of the wall covering or the presence of young children.

It will be apparent that while a preferred embodiment of the invention has been shown and described, various modifications and changes may be made without departing from the true spirit and scope of the invention. For example, spring 21 may have any suitable configuration and composition (e.g. plastic or steel), and no limitation is intended by that which is illustrated in the drawings.

Having thus set forth a preferred embodiment of the invention, what is claimed is:

1. A combination including a cover plate having an aperture for receiving therethrough electrical receptacle means and a safety guard plate for preventing unauthorized access to said receptacle means, said combination comprising:

means for pivotably connecting together respective first ends of said cover plate and safety guard plate, so that said guard plate may be rotated to a position over said cover plate by which to prevent access thereto, push bar means positioned adjacent said cover plate and adapted for reciprocal movement therealong, retaining bar means extending from said cover plate for supporting said push bar means and maintaining the position thereof adjacent said cover plate, spring means disposed between said push bar means and said retaining bar means so as to bias said push bar means for reciprocal movement, first and second interlocking means, said first interlocking means connected to said safety guard plate for receipt of said second interlocking means when said guard plate is rotated over said cover plate, and said second interlocking means connected to said push bar means so as to be received by said first interlocking means and thereby releasably secure said safety guard plate over said cover plate.

2. The combination recited in claim 1, wherein said push bar means includes a push bar surface which may be depressed to cause a movement of said push bar means against the bias of said spring means and a corresponding removal of said second interlocking means from said first interlocking means, so as to permit said safety guard plate to be released from said cover plate and allow access to said electrical receptacle means.

3. The combination recited in claim 2, wherein said push bar surface is separated from and aligned substantially parallel with said retaining bar means adjacent said cover plate such that said spring means is disposed therebetween, the movement of said push bar means along said cover plate being in a direction so as to cause the separation between said push bar surface and said retaining bar means to change.

4. The combination recited in claim 1, wherein said first interlocking means comprises at least one catch having a recess formed therein for receipt of said second interlocking means.

5. The combination recited in claim 4, wherein said second interlocking means comprises at least one post to be received in the recess of said first interlocking means catch.

6. The combination recited in claim 1, further comprising frame members extending outwardly from each of the sides of said cover plate for guiding said push bar means, said push bar means and said second interlocking means connected thereto being movable along said cover plate between said frame members.

* * * * *